US011095326B2

(12) United States Patent
Kim et al.

(10) Patent No.: US 11,095,326 B2
(45) Date of Patent: *Aug. 17, 2021

(54) WIDE BANDWIDTH DIGITAL PREDISTORTION SYSTEM WITH REDUCED SAMPLING RATE

(71) Applicant: DALI SYSTEMS CO. LTD., George Town (KY)

(72) Inventors: Wan-Jong Kim, Port Moody (CA); Shawn Patrick Stapleton, Vancouver (CA)

(73) Assignee: DALI SYSTEMS CO. LTD., George Town (KY)

( * ) Notice: Subject to any disclaimer, the term of this patent is extended or adjusted under 35 U.S.C. 154(b) by 0 days.

This patent is subject to a terminal disclaimer.

(21) Appl. No.: 16/922,773

(22) Filed: Jul. 7, 2020

(65) Prior Publication Data
US 2020/0336161 A1 Oct. 22, 2020

Related U.S. Application Data

(63) Continuation of application No. 16/240,433, filed on Jan. 4, 2019, now Pat. No. 10,727,879, which is a
(Continued)

(51) Int. Cl.
*H04K 1/02* (2006.01)
*H04B 1/04* (2006.01)
(Continued)

(52) U.S. Cl.
CPC ............ *H04B 1/0475* (2013.01); *H03F 1/02* (2013.01); *H03F 1/3241* (2013.01); *H03F 3/24* (2013.01);
(Continued)

(58) Field of Classification Search
CPC ............... H04B 1/0475; H04B 1/0017; H04B 2001/0425; H04B 2001/0433;
(Continued)

(56) References Cited

U.S. PATENT DOCUMENTS 6,125,266 A 9/2000 Matero et al.
6,298,097 B1 10/2001 Shalom
(Continued)

FOREIGN PATENT DOCUMENTS

CN 101431316 A 5/2009
EP 1517500 A1 3/2005
(Continued)

OTHER PUBLICATIONS

U.S. Appl. No. 16/943,227, filed Jul. 30, 2020, Kim et al.
(Continued)

*Primary Examiner* — Zewdu A Kassa
(74) *Attorney, Agent, or Firm* — Artegis Law Group, LLP

(57) ABSTRACT

A digital predistortion linearization method is provided for increasing the instantaneous or operational bandwidth for RF power amplifiers employed in wideband communication systems. Embodiments of the present invention provide a method of increasing DPD linearization bandwidth using a feedback filter integrated into existing digital platforms for multi-channel wideband wireless transmitters. An embodiment of the present invention utilizes a DPD feedback signal in conjunction with a low power band-pass filter in the DPD feedback path.

24 Claims, 13 Drawing Sheets

Related U.S. Application Data continuation of application No. 15/492,902, filed on Apr. 20, 2017, now Pat. No. 10,218,392, which is a continuation of application No. 14/987,093, filed on Jan. 4, 2016, now Pat. No. 9,673,848, which is a continuation of application No. 14/552,231, filed on Nov. 24, 2014, now Pat. No. 9,258,022, which is a continuation of application No. 13/777,194, filed on Feb. 26, 2013, now Pat. No. 8,913,689.

(51) Int. Cl.
*H03F 1/02* (2006.01)
*H03F 1/32* (2006.01)
*H03F 3/24* (2006.01)
*H04B 1/00* (2006.01)

(52) U.S. Cl.
CPC ...... *H04B 1/0017* (2013.01); *H04B 2001/045* (2013.01); *H04B 2001/0425* (2013.01); *H04B 2001/0433* (2013.01)

(58) Field of Classification Search
CPC ... H04B 2001/045; H03F 1/02; H03F 1/3241; H03F 3/24
USPC .................. 375/297, 296, 295, 316, 219
See application file for complete search history.

(56) References Cited

U.S. PATENT DOCUMENTS

| | | |
|---|---|---|
| 6,549,067 B1 | 4/2003 | Kenington |
| 7,542,518 B2 | 6/2009 | Kim et al. |
| 7,983,327 B2 | 7/2011 | Brobston |
| 8,005,162 B2 | 8/2011 | Cai et al. |
| 8,149,950 B2 | 4/2012 | Kim et al. |
| 8,498,591 B1 | 6/2013 | Qian et al. |
| 8,576,943 B2 | 11/2013 | Kilambi et al. |
| 8,873,674 B2 | 10/2014 | Kim et al. |
| 8,913,689 B2 | 12/2014 | Kim et al. |
| 8,982,995 B1 | 3/2015 | Van Cai |
| 9,197,259 B2 | 11/2015 | Kim et al. |
| 9,258,022 B2 | 2/2016 | Kim et al. |
| 9,673,848 B2 | 6/2017 | Kim et al. |
| 10,218,392 B2 | 2/2019 | Kim et al. |
| 10,256,853 B2 | 4/2019 | Kim et al. |
| 10,727,879 B2 | 7/2020 | Kim et al. |
| 10,749,553 B2 | 8/2020 | Kim et al. |
| 2004/0136470 A1 | 7/2004 | DeBruyn et al. |
| 2004/0152426 A1 | 8/2004 | Suzuki et al. |
| 2005/0180526 A1 | 8/2005 | Kim et al. |
| 2007/0063769 A1 | 3/2007 | Jelonnek |
| 2008/0049868 A1 | 2/2008 | Brobston |
| 2008/0211576 A1 | 9/2008 | Moffatt et al. |
| 2009/0232191 A1 | 9/2009 | Gupta et al. |
| 2009/0232507 A1 | 9/2009 | Gupta et al. |
| 2009/0238206 A1 | 9/2009 | Hamada et al. |
| 2009/0256630 A1 | 10/2009 | Brobston |
| 2010/0159856 A1 | 6/2010 | Kato et al. |
| 2010/0300891 A1 | 12/2010 | Rivera |
| 2010/0308910 A1 | 12/2010 | Barnes |
| 2012/0128009 A1 | 5/2012 | Yang et al. |
| 2012/0128099 A1 | 5/2012 | Morris et al. |
| 2012/0154038 A1 | 6/2012 | Kim et al. |
| 2012/0200355 A1* | 8/2012 | Braithwaite .......... H03F 1/3241 330/147 |
| 2013/0077713 A1 | 3/2013 | Kim et al. |
| 2014/0133602 A1 | 5/2014 | Mujica et al. |
| 2014/0139286 A1 | 5/2014 | Laporte |
| 2014/0241461 A1 | 8/2014 | Kim et al. |
| 2014/0376661 A1 | 12/2014 | Kim et al. |
| 2015/0172081 A1 | 6/2015 | Wloczysiak |
| 2015/0180519 A1 | 6/2015 | Kim et al. |
| 2015/0194989 A1 | 7/2015 | Mkadem et al. |
| 2016/0191087 A1 | 6/2016 | Kim et al. |
| 2016/0261294 A1 | 9/2016 | Kim et al. |
| 2017/0207802 A1 | 7/2017 | Pratt et al. |
| 2017/0353199 A1 | 12/2017 | Kim et al. |
| 2019/0280722 A1 | 9/2019 | Kim et al. |

FOREIGN PATENT DOCUMENTS

| | | |
|---|---|---|
| JP | 2006-135612 A | 5/2006 |
| WO | WO 2008/146355 | 12/2008 |
| WO | WO 2013/044238 | 3/2013 |

OTHER PUBLICATIONS

International Search Report for International Application No. PCT/US2012/056918, dated Dec. 24, 2012.
Written Opinion for International Application No. PCT/US2012/056918, dated Dec. 24, 2012.
International Preliminary Report on Patentability for International Application No. PCT/US2012/056918, dated Apr. 3, 2014.
First Office Action (Including Translation) for Chinese Patent Application No. 2012800459100, dated Oct. 29, 2015.
Second Office Action (Including Translation) for Chinese Patent Application No. 2012800459100, dated Aug. 12, 2016.
Notification to Grant Patent Right for Invention (Including Translation) for Chinese Patent Application No. 2012800459100, dated Feb. 3, 2017.
European Search Report for European Application No. 12832831.7, dated May 8, 2015.
Office Action for European Application No. 12832831.7, dated Feb. 8, 2017.
Summons to Attend Oral Proceedings for European Application No. 12832831.7, mailed Jan. 5, 2018.
Examiner Interview Summary for European Application No. 12832831.7, dated May 4, 2018.
Notice of Reasons for Refusal (Including Translation) for Japanese Patent Application No. 2014-532074, dated May 10, 2016.
Decision to Grant a Patent (Including Translation) for Japanese Patent Application No. 2014-532074, dated Dec. 19, 2016.
Notification of Reasons for Refusal (Including Translation) for Korean Application No. 10-2014-7010583, dated Aug. 17, 2018.
Notice of Allowance (Including Translation) for Korean Application No. 10-2014-7010583, dated May 16, 2019.
Office Action for U.S. Appl. No. 13/625,760, dated Feb. 24, 2014.
Notice of Allowance for U.S. Appl. No. 13/625,760, dated May 27, 2014.
Office Action for U.S. Appl. No. 14/480,267, dated Feb. 18, 2015.
Notice of Allowance for U.S. Appl. No. 14/480,267, dated Jul. 17, 2015.
Office Action for U.S. Appl. No. 14/918,371, dated May 31, 2016.
Office Action for U.S. Appl. No. 14/918,371, dated Jan. 19, 2017.
Office Action for U.S. Appl. No. 14/918,371, dated Sep. 14, 2017.
Office Action for U.S. Appl. No. 14/918,371, dated Mar. 16, 2018.
Notice of Allowance for U.S. Appl. No. 14/918,371, dated Nov. 19, 2018.
Office Action for U.S. Appl. No. 16/279,535, dated Oct. 28, 2019.
Notice of Allowance for U.S. Appl. No. 16/279,535, dated Apr. 9, 2020.
Office Action for U.S. Appl. No. 13/777,194, dated Apr. 7, 2014.
Notice of Allowance for U.S. Appl. No. 13/777,194, dated Aug. 18, 2014.
Office Action for U.S. Appl. No. 14/552,231 dated May 1, 2015.
Notice of Allowance for U.S. Appl. No. 14/552,231 dated Sep. 28, 2015.
Office Action for U.S. Appl. No. 14/987,093 dated Jul. 14, 2016.
Notice of Allowance U.S. Appl. No. 14/987,093 dated Feb. 1, 2017.
Office Action for U.S. Appl. No. 15/492,902 dated Jan. 5, 2018.
Notice of Allowance for U.S. Appl. No. 15/492,902 dated Oct. 4, 2018.
Office Action for U.S. Appl. No. 16/240,433 dated Jul. 29, 2019.
Notice of Allowance for U.S. Appl. No. 16/240,433 dated Mar. 20, 2020.
U.S. Appl. No. 13/625,760, filed Sep. 24, 2012 U.S. Pat. No. 8,873,674.

(56) References Cited

OTHER PUBLICATIONS

U.S. Appl. No. 14/480,267, filed Sep. 8, 2014 U.S. Pat. No. 9,197,259.
U.S. Appl. No. 14/918,371, filed Oct. 20, 2015 U.S. Pat. No. 10,256,853.
U.S. Appl. No. 16/279,535, filed Feb. 19, 2019 U.S. Pat. No. 10,749,553.
U.S. Appl. No. 16/943,227, filed Jul. 30, 2020.
U.S. Appl. No. 13/777,197, filed Feb. 26, 2013 U.S. Pat. No. 8,913,689.
U.S. Appl. No. 14/552,231, filed Nov. 24, 2014 U.S. Pat. No. 9,258,022.
U.S. Appl. No. 14/987,093, filed Jan. 4, 2016 U.S. Pat. No. 9,673,848.
U.S. Appl. No. 15/492,902, filed Apr. 20, 2017 U.S. Pat. No. 10,218,392.
U.S. Appl. No. 16/240,433, filed Jan. 4, 2019 U.S. Pat. No. 10,727,879.
Non-Final Office Action for U.S. Appl. No. 16/943,227 dated Feb. 17, 2021, 11 pages.

* cited by examiner

WIDE BANDWIDTH DIGITAL PREDISTORTION SYSTEM WITH REDUCED SAMPLING RATE

CROSS-REFERENCE TO RELATED APPLICATIONS

This application is a continuation of U.S. patent application Ser. No. 16/240,433, filed Jan. 4, 2019, which is a continuation of U.S. patent application Ser. No. 15/492,902, filed on Apr. 20, 2017, now U.S. Pat. No. 10,218,392, which is a continuation of U.S. patent application Ser. No. 14/987,093, filed on Jan. 4, 2016, now U.S. Pat. No. 9,673,848, which is a continuation of U.S. patent application Ser. No. 14/552,231, filed on Nov. 24, 2014, now U.S. Pat. No. 9,258,022, which is a continuation of U.S. patent application Ser. No. 13/777,194, filed on Feb. 26, 2013, now U.S. Pat. No. 8,913,689, which is related to U.S. patent application Ser. No. 13/625,760, filed on Sep. 24, 2012, now U.S. Pat. No. 8,873,674, the disclosures of each are hereby incorporated by reference in their entirety for all purposes. U.S. Pat. No. 8,149,950, issued on Apr. 3, 2012 is hereby incorporated by reference in its entirety for all purposes.

BACKGROUND OF THE INVENTION

The present invention generally relates to wideband communication systems using multiplexing modulation techniques. More specifically, the present invention relates to a method of increasing instantaneous or operational bandwidth for digital predistortion linearization in order to compensate for nonlinearities and/or memory effects in multi-channel wideband wireless transmitters.

The linearity and efficiency of radio frequency (RF) power amplifiers (PAs) have become critical design issues for non-constant envelope digital modulation schemes with high peak-to-average power ratio (PAR) values. This has happened as a result of the increased importance of spectral efficiency in wireless communication systems. RF PAs have nonlinearities which generate amplitude modulation—amplitude modulation (AM-AM) distortion and amplitude modulation—phase modulation (AM-PM) distortion at the output of the PA. These undesired effects may create spectral regrowth in the adjacent channels, as well as in-band distortion which may degrade the error vector magnitude (EVM). Commercial wireless communication systems may for example employ a bandwidth in the range of 20 MHz to 25 MHz. In such an example, these spectral regrowth effects create an undesired impact over a frequency band which is more than 100 MHz to 125 MHz wide. The potential impacts may include inter-system and intra-system interference. Therefore, there is a need in the art for improved methods and systems related to communications systems.

SUMMARY OF THE INVENTION

It is advisable to employ a linearization technique in RF PA applications in order to eliminate or reduce spectral regrowth and in-band distortion effects. Various RF PA linearization techniques have been proposed in the literature such as feedback, feedforward and predistortion. One of the most promising linearization techniques is baseband digital predistortion (DPD), which takes advantage of recent advances in digital signal processors. DPD can achieve better linearity and higher power efficiency with a reduced system complexity when compared to the widely-used conventional feedforward linearization technique. Moreover, a software implementation provides the digital predistorter with a re-configurability feature which is desirable for multi-standards environments. In addition, a PA using an efficiency enhancement technique such as a Doherty power amplifier (DPA) is able to achieve higher efficiencies than traditional PA designs, at the expense of linearity. Therefore, combining DPD with a DPA using an efficiency enhancement technique has the potential for maximizing system linearity and overall efficiency.

Requirements for instantaneous bandwidth (for example, exceeding 25 MHz) for next generation wireless systems continue to increase, which means that the DPD processing speed needs to be increased accordingly. This higher processing speed may result in new digital platform design efforts, which can often take several months and significant staff resources and costs to complete. The higher processing speed can also result in higher system costs and increased power consumption due to sampling rate increases for DPD in Field Programmable Gate Arrays (FPGAs), digital-to-analog converters (DACs), and analog-to-digital converters (ADCs). In addition, RF/IF filter requirements are more stringent, which will also likely increase system costs and complexity. Another typical result of having DPD with a wider instantaneous bandwidth may be increased memory effects. This may cause the DPD algorithm to become much more complex and will take longer to design, optimize and test.

Embodiments of the present invention provide DPD linearization methods and systems that provide wider bandwidth without adding a high degree of complexity and cost.

Accordingly, embodiments of the present invention overcome the limitations previously discussed. Embodiments of the present invention provide a method of increasing DPD linearization bandwidth without costly modifications to an existing digital platform for multi-channel wideband wireless transmitters. To achieve the above objects, according to some embodiments of the present invention, a DPD feedback signal is employed along with a narrow band-pass filter in the DPD feedback path. The embodiments described herein are able to extend the DPD bandwidth obtainable with an existing digital transmitter system, without changes in digital signal processing components, which could result in increased power consumption and/or cost.

Numerous benefits are achieved by way of the present invention over conventional techniques. As described more fully herein, the digital finite impulse response (FIR) filter characteristic for DPD output is important in order to avoid the overlapping of distortions, which can cause errors in an indirect learning algorithm based on DPD output and feedback input. This can result in the need to utilize digital FIR filters with a large number of taps. Embodiments of the present invention may provide for the removal of the digital FIR filter by using a direct learning algorithm based on DPD input and feedback input. Accordingly, embodiments of the present invention may decrease the number of multipliers for multiband applications and even for single band applications. Moreover, an analog filter characteristic in the analog feedback path may also be provided in order to avoid the overlapping of distortions, which can cause errors in the calculation of coefficients. Thus, embodiments of the present invention reduce or eliminate the need for one or more multi-pole ceramic filters, which are big and expensive, replacing them with one or more less-stringent ceramic filters that only removes aliasing in the feedback ADC. Accordingly, the digital FIR filter with a large number of taps can be inserted in order to avoid the overlapping. Furthermore, one filter can be shared for multiband applications. Consequently, embodiments of the present invention can utilize a normal ceramic filter and one sharp digital filter with a large number of taps. These and other embodiments of the invention along with many of its advantages and features are described in more detail in conjunction with the text below and attached figures.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE INVENTION

In general, the DPD techniques of the present invention can effectively improve the adjacent channel power ratio (ACPR). However, DPD performance suffers from the limited bandwidth associated with the speed limitation of the ADC employed in the DPD feedback path. This ADC is critical to processing the DPD feedback signals. Although modifying a product design to employ an ADC with a higher sampling rate would likely lead to enhanced DPD performance, that approach would increase the complexity and cost of the DPD function and would therefore result in higher system cost. This is obviously an undesirable approach for meeting new and evolving system requirements. In order to overcome these limitations, the present invention utilizes the bandpass characteristic of the duplexer associated with frequency division duplex wireless systems, so that the DPD is only required to provide distortion reduction over the reduced bandwidth of the PA output signals. The system provided by the present invention is therefore referred to as an enhanced-bandwidth digital predistortion (EBWDPD) system hereafter. Embodiments of the EBWDPD system are illustrated with respect to the accompanying drawings.

In conventional systems, the bandwidth associated with the DPD system is typically required to be five times the bandwidth of the input signal. For example, for a conventional system with a 20 MHz input signal bandwidth, the DPD function requires at least 100 MHz bandwidth for the DPD output and DPD feedback input, which means that feedback ADC sampling rate should be at least 200 Msps. This is a critical factor for a conventional DPD implementation.

Figure 2:
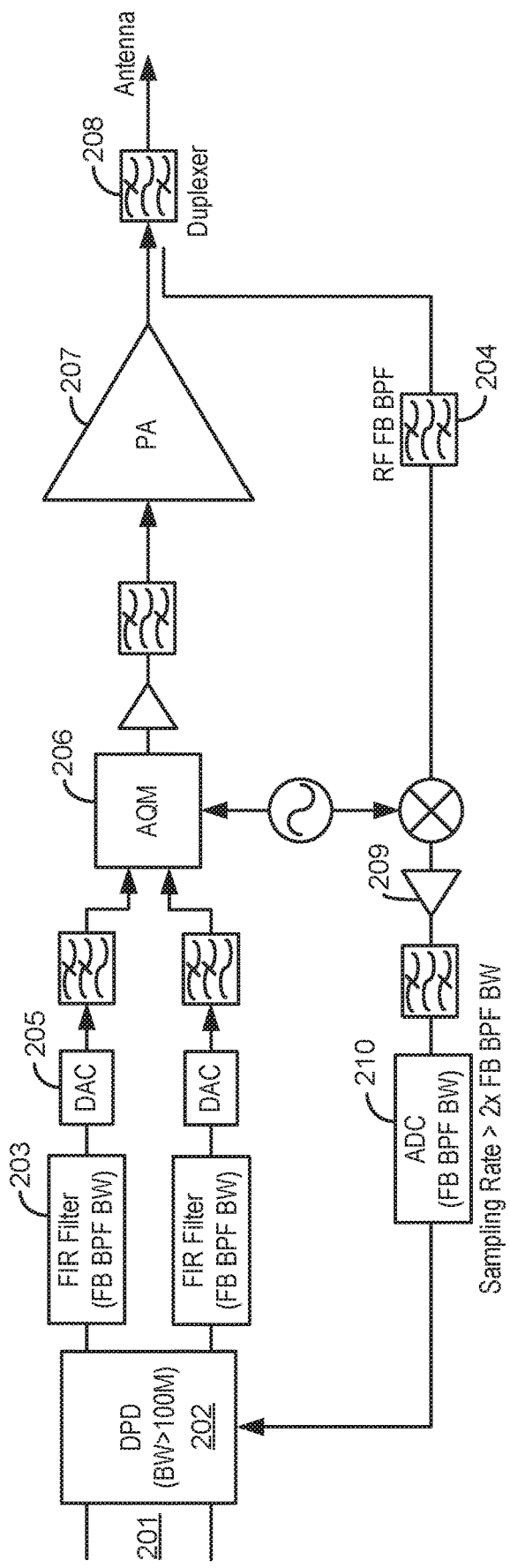
FIG. 2 is a schematic block diagram illustrating a multi-carrier wideband power amplifier system according to an embodiment of the present invention.

FIG. 2 is a schematic block diagram illustrating a multi-carrier wideband power amplifier system according to an embodiment of the present invention. The system illustrated in FIG. 2 comprises digital complex input samples 201 (with bandwidth of 20 MHz), digital predistortion circuits 202 (with bandwidth exceeding 100 MHz), a digital filter 203 with a similar bandwidth to that of the feedback band-pass filter 204 (FB BPF), digital-to-analog converters 205, an IQ modulator shown as AQM 206, a power amplifier 207, a duplexer 208 (with bandwidth of 20 MHz), radio frequency down-conversion circuits 209 with a low power feedback RF band-pass filter 204 (RF FB BPF) for the output coupled at the output of the PA 210, and an analog-to-digital converter 210 (with a bandwidth typically greater than the RF FB BPF bandwidth obtained by employing a sampling rate greater than two times the FB BPF bandwidth value) for the DPD feedback path. The RF FB BPF 204 filters the feedback signal to provide a signal characterized by a reduced bandwidth in comparison with the output of the power amplifier. DPD coefficients are extracted from the feedback signal produced by the RF FB BPF 204, which has a reduced bandwidth associated with the filter 204.

The DPD 202 introduces distortion components associated with the 3rd order and 5th order expansion of the input signal, which causes the DPD output bandwidth to be larger than approximately 100 MHz based on a 20 MHz input signal. In order to avoid instability of the DPD algorithm due to inaccurate error calculation from the DPD output (with bandwidth exceeding 100 MHz) and feedback signal (with FB BPF bandwidth), the DPD output is filtered by a digital filter 203 having a bandwidth value similar to that of the RF FB BPF 204. Embodiments of the present invention utilize an RF FB BPF 204 with a suitable bandwidth value as described more fully in relation to FIGS. 7A-7C. The bandwidth of filter 204 is less than the DPD bandwidth, which contrasts with conventional systems in which filter 204 would have a bandwidth equal to the DPD bandwidth. Additionally, the ADC 210 has a bandwidth associated with the FIR filter 203 in some embodiments, which is less than the DPD bandwidth.

It should be noted that in comparison with conventional systems, the bandwidth of various components in the multi-carrier wideband power amplifier system illustrated in FIG. 2 are reduced, thereby reducing system complexity and cost. As an example, the digital filter 203 has a bandwidth similar to that of the feedback band-pass filter 204 rather than exceeding 100 MHz based on the bandwidth of the digital predistortion circuits. The ADC 210 has a bandwidth typically greater than the RF FB BPF bandwidth obtained by employing a sampling rate greater than two times the FB BPF bandwidth value. Thus, embodiments of the present invention utilize components that operate at lower bandwidths and sampling rates than conventional components in a conventional system, reducing the system cost and complexity.

Figure 3:
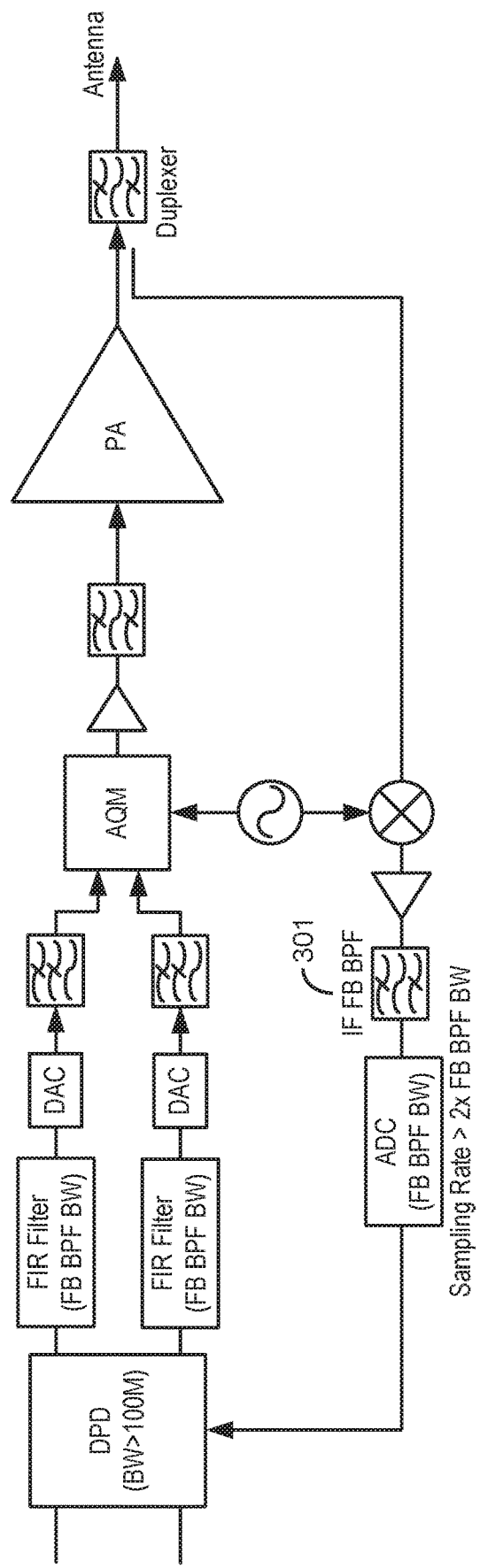
FIG. 3 is a schematic block diagram illustrating a multi-carrier wideband power amplifier system according to another embodiment of the present invention.

FIG. 3 is a schematic block diagram illustrating a multi-carrier wideband power amplifier system according to another embodiment of the present invention. This embodiment shares some common features with the system illustrated in FIG. 2 as well as some differences. As illustrated in FIG. 3, the system includes a low power narrowband IF band-pass filter 301. Embodiments of the present invention provided by the system illustrated in FIG. 3 may be easier and less costly to design and implement using an IF BPF filter compared to using an RF band-pass filter. With an IF filter, the present invention is applicable to systems employed with various applications based on the use of a common IF frequency. As was the case for the embodiment shown in FIG. 2, the feedback ADC following the IF FB BPF employs a sampling rate greater than two times the FB BPF bandwidth value for the DPD feedback path. This helps reduce the implementation cost while providing high performance. The feedback loop provides inputs (e.g., a measure of distortion in the power amplifier 207) that are used to introduce distortion that compensates for the amplifier distortion.

The embodiments shown in FIGS. 2 and 3 may employ a digital filter 203 characterized by a bandwidth that is less than the bandwidth (e.g., >100 MHz) used in conventional systems. Additionally, the embodiments shown in FIGS. 2 and 3 may include either a low power feedback IF BPF or an RF BPF coupled to the PA output. Thus, filtering can be performed at RF or IF according to various embodiments of the present invention.

Figure 4A:
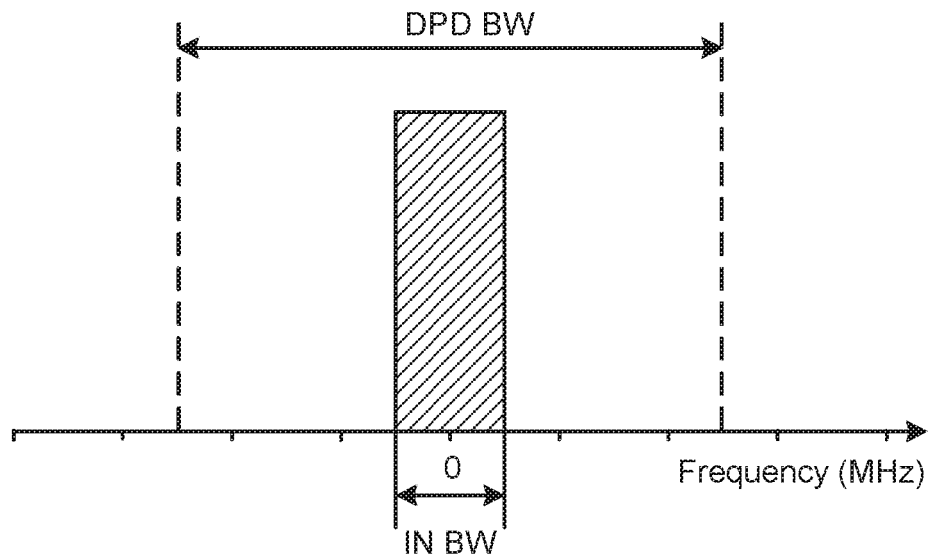
FIGS. 4A-4D are graphs showing the DPD bandwidth characteristics for a conventional system.
Figure 4B:
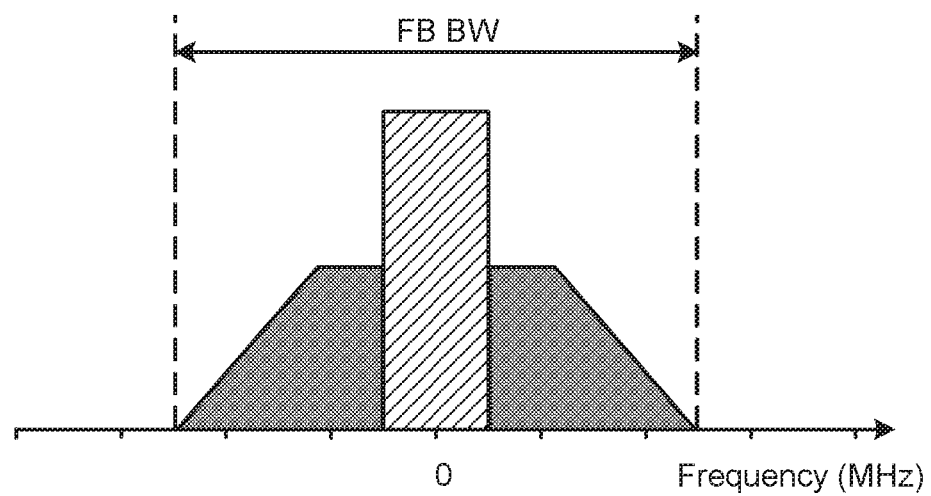
Figure 4C:
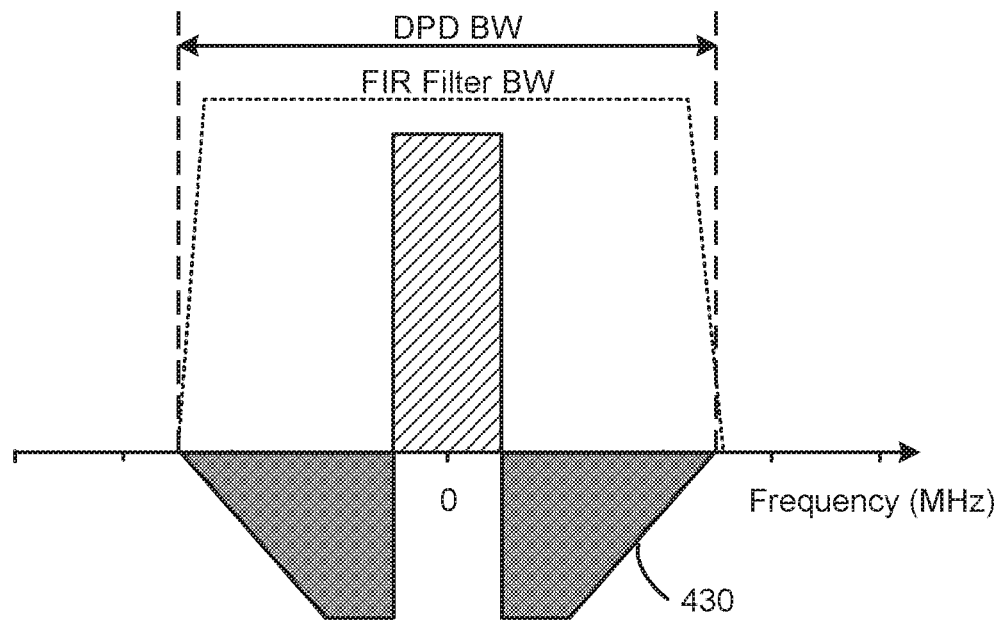
Figure 4D:
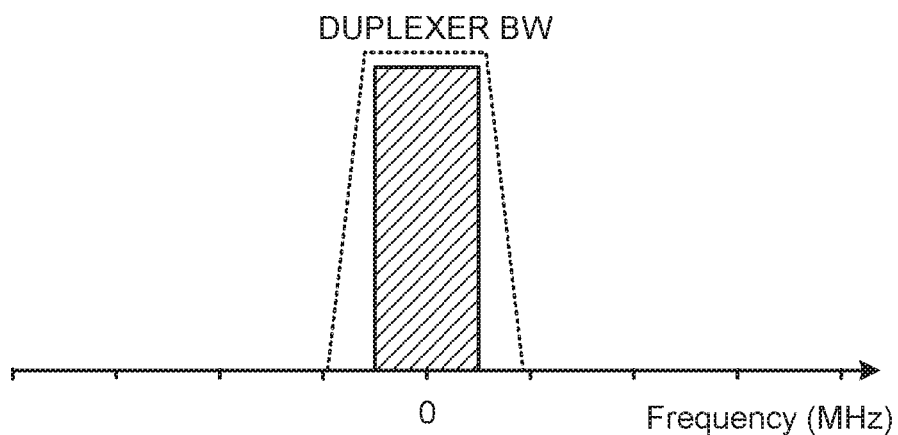

FIGS. 4A-4D are graphs showing the DPD bandwidth characteristics for a conventional system. The DPD bandwidth for conventional systems is required to be greater than 5 times the value of the input signal bandwidth. FIG. 4A shows the DPD input signal. FIG. 4B shows the feedback signal, with distortion components (dark shading) over a fairly wide bandwidth of FB BW. FIG. 4C shows the DPD output signal with predistortion components (based on the feedback signal) along with the FIR digital filter bandpass characteristic. The signal with predistortion components has a bandwidth of slightly less than the DPD bandwidth. FIG. 4D shows the PA/duplexer output signal with distortion having been canceled. The data is included in the central spectral band and distortion is illustrated in FIG. 4B and a distortion component with a 180 degrees phase shift (out of phase) is illustrated in FIG. 4C, resulting in cancellation of the distortion and the signal illustrated in FIG. 4D, with no significant out of band power. In some embodiments, the signal at the output of DPD 202 is similar to that illustrated in FIG. 4B.

As illustrated in FIG. 4D, the duplexer bandwidth is slightly greater than the bandwidth of the data spectrum. Embodiments of the present invention utilize the filtering properties of the duplexer 208 to assist in removing some of the out of band power from the spectrum. Because of the use of the duplexer, it is not necessary to correct across the entire bandwidth (e.g., FB BW), but only a portion of the bandwidth with the duplexer providing a filtering function.

Figure 5A:
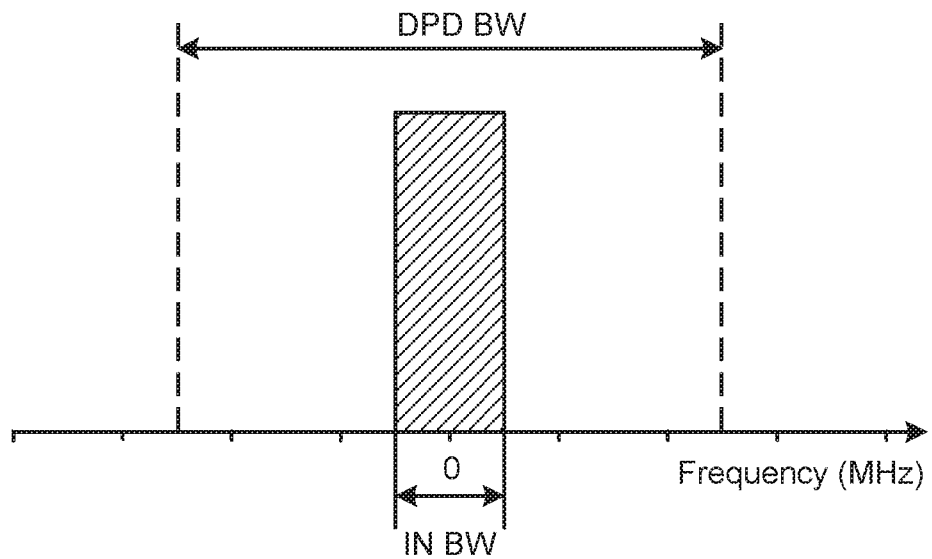
FIGS. 5A-5D are graphs showing the DPD bandwidth characteristics according to an embodiment of the present invention.
Figure 5B:
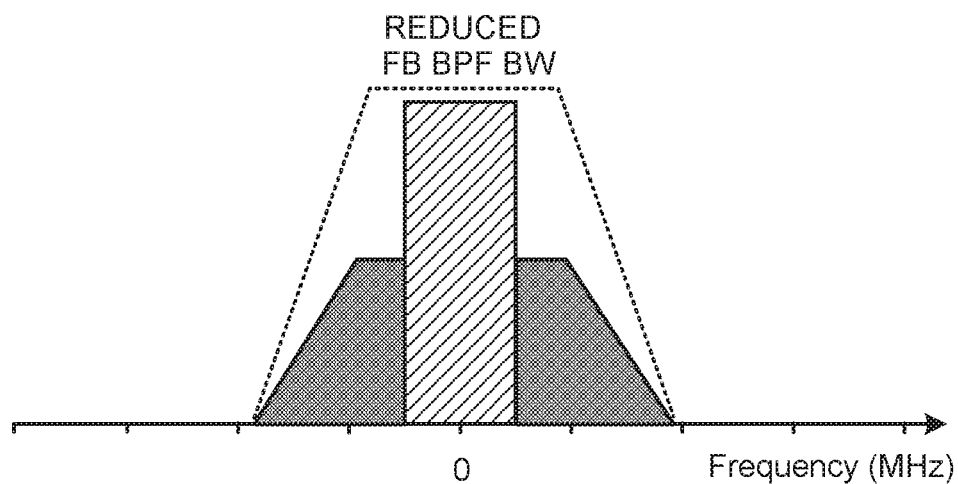

FIGS. 5A-5D are graphs showing the DPD bandwidth characteristics according embodiments of the present invention. As explained above in relation to FIG. 2, the DPD bandwidth is associated with the FB BPF bandwidth, which is less than the bandwidth required by conventional systems. FIG. 5A shows the DPD input signal. FIG. 5B shows the bandwidth of the feedback signal after the FB BPF 204. As illustrated in FIG. 5B, the bandwidth of the feedback signal after the FB BPF 204 is reduced in comparison to the DPD bandwidth. Thus, referring to FIG. 2, RF feedback band pass filter (RF FB BPF) 204 has a bandwidth as illustrated in FIG. 5B. This bandwidth is reduced in comparison to the DPD bandwidth.

Figure 5C:
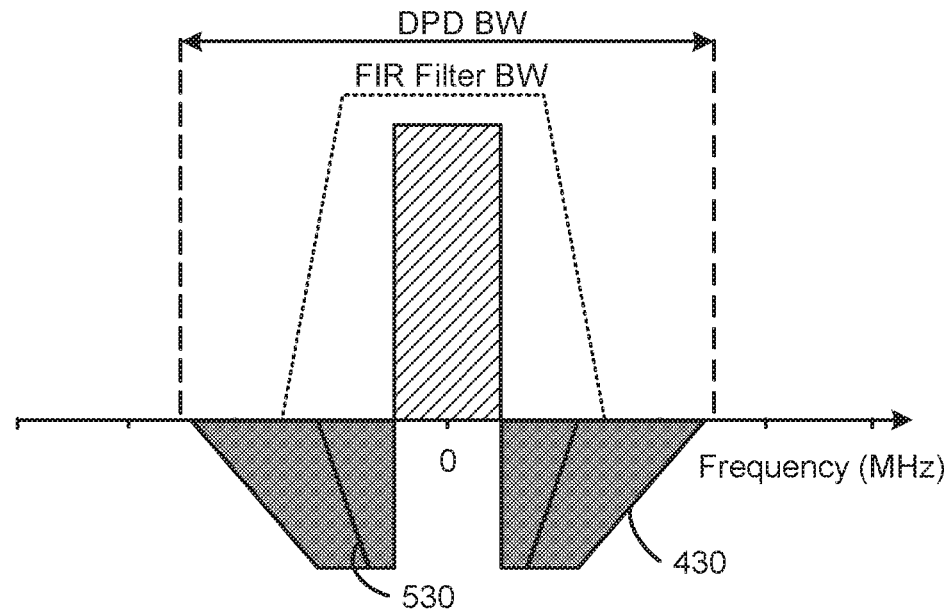

FIG. 5C shows the DPD output signal with predistortion components (based on the feedback signal) along with the narrower FIR digital filter bandpass characteristic, compared to that for a conventional system. The signal with predistortion components has a bandwidth of much less than the DPD bandwidth. As illustrated in FIG. 5C, the predistortion component 430 (see FIG. 4C) is greater than the predistortion component 530. This results from the filtering properties provided by RF FB BPF 204. It should be noted that the bandwidth associated with the predistortion component 530 is much narrower than the DBD BW.

Figure 5D:
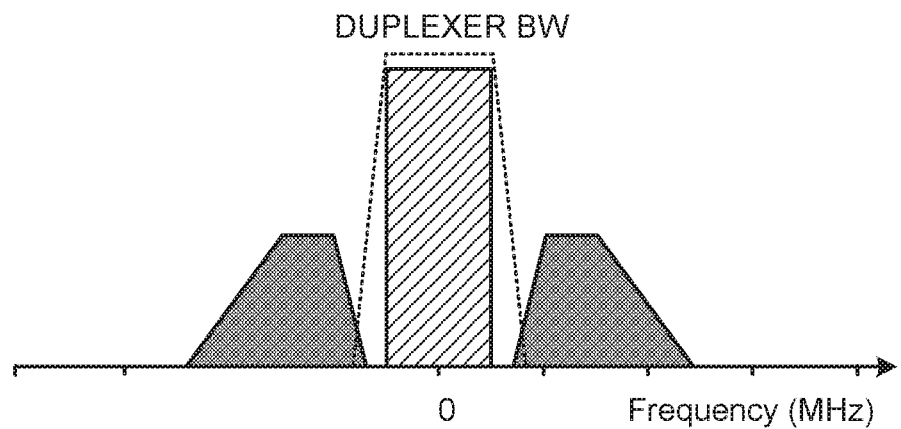

FIG. 5D shows the PA/duplexer output signal. In contrast with FIG. 4D, the Duplexer has a significant role in reducing output distortion well outside the bandwidth of the input signal. Close to the respective band edges of the desired signal, the DPD provides a substantial amount of distortion reduction. Thus, using the filtering properties of the duplexer enables compensation over a smaller range than otherwise available. Close to the carrier, the out of band power (outside the data spectrum) is substantially zero as a result of the digital predistortion techniques used herein. Although some out of band power is present, the majority of the power is outside the bandwidth of the duplexer, resulting in the majority of the power being filtered by the duplexer.

Figure 6:
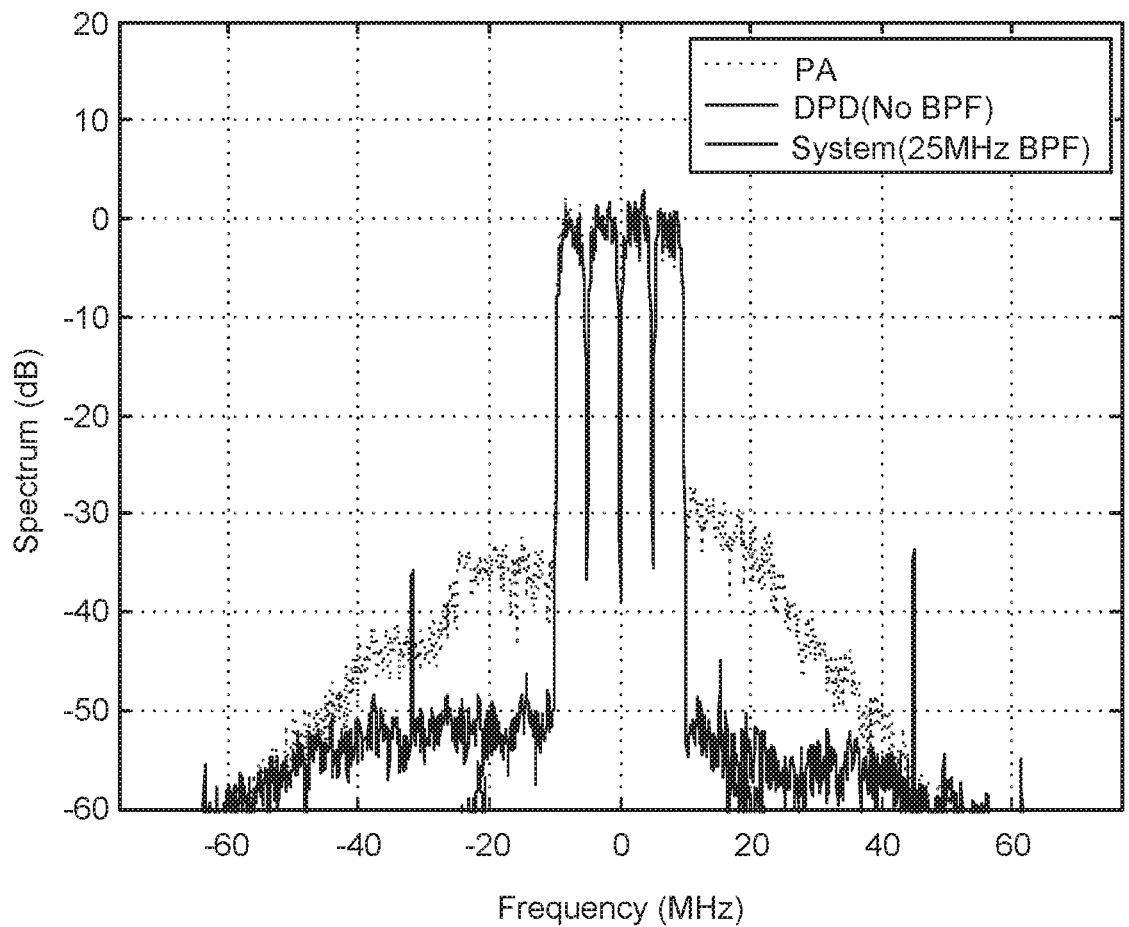
FIG. 6 is a plot showing spectral output response for a conventional system employing DPD.

FIG. 6 is a plot showing spectral output response for a conventional system employing DPD. The results in FIG. 6 are for a conventional PA system without any FB BPF. The results are for a 4 carrier WCDMA input signal (with a total bandwidth of 20 MHz) and 60 W average output power. The bandwidth of the distortion is ~100 MHz (i.e., 5 times the signal bandwidth). DPD reduces distortion more than 20 dB.

Figure 7A:
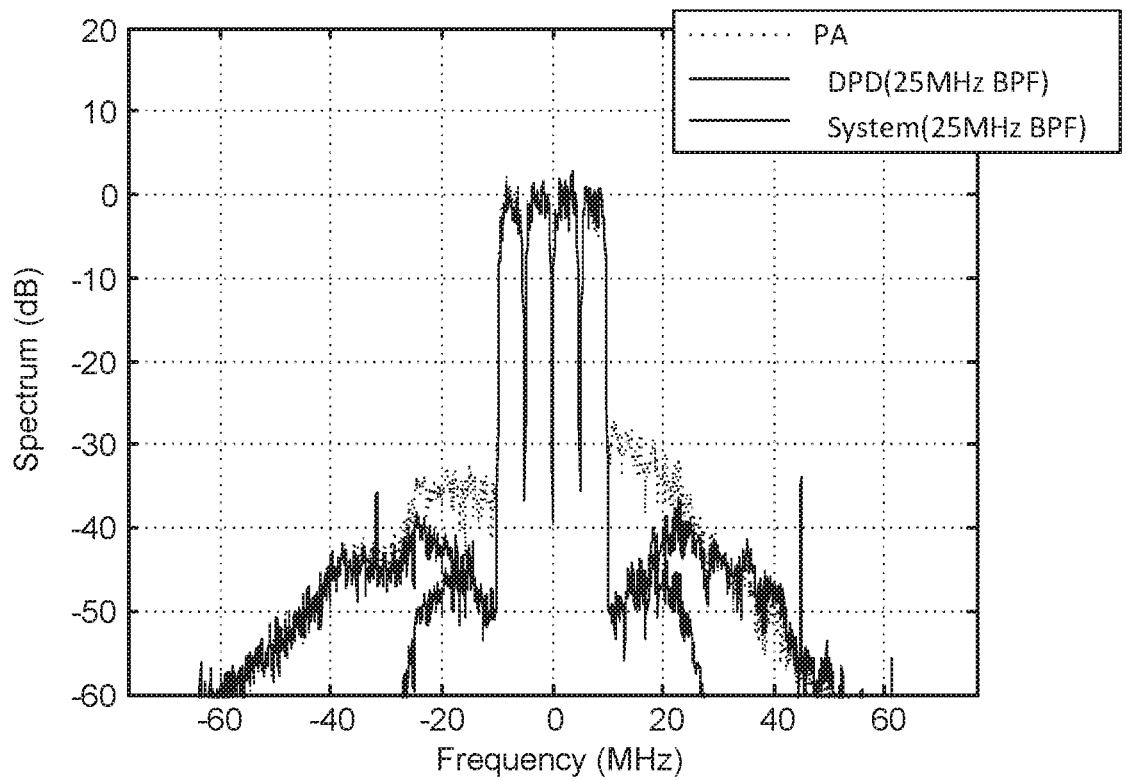
FIGS. 7A-7C are plots showing spectral output response for systems according to various embodiments of the present invention.
Figure 7B:
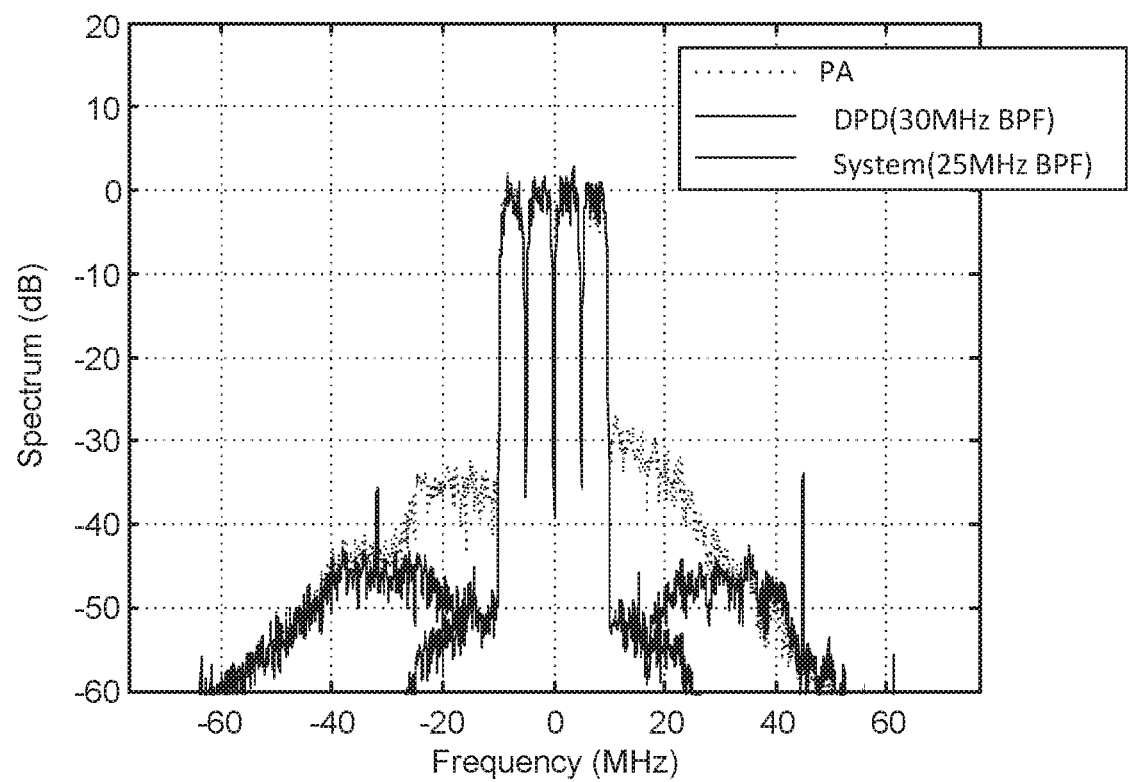
Figure 7C:
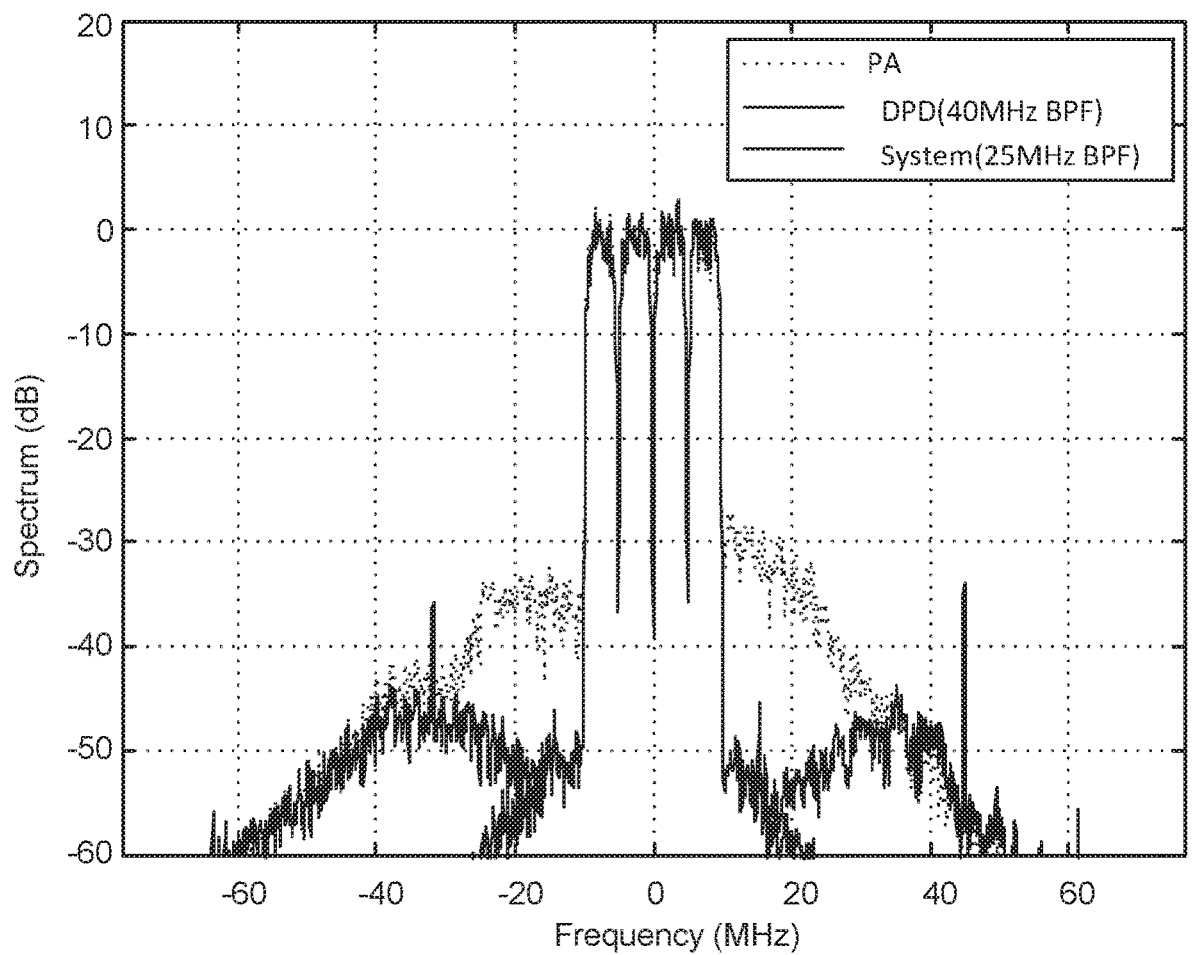

FIGS. 7A-7C are plots showing spectral output response for systems according to various embodiments of the present invention. The spectrum shown in FIGS. 7A-7C illustrate DPD performance based on various values of FB BPF bandwidth (FIR filter 203) (25 MHz, 30 MHz and 40 MHz respectively). With 25 MHz FB BPF bandwidth, the spectrum associated with DPD performance includes noise at a predetermined level. Systems using FB BPF bandwidths of 30 MHz and 40 MHz provide results for DPD performance that are comparable to the DPD performance for conventional systems, while utilizing an ADC 210 having a much lower sampling rate than the feedback ADC employed in a conventional system, which may be >100 MHz. Additionally, embodiments of the present invention utilize a filter 203 that is characterized by much lower bandwidth than a conventional filter in a conventional system which has a typical value of bandwidth greater than five times the signal bandwidth. The system bandwidth (i.e., 25 MHz) refers to the feedback loop and the bandwidth of RF FB BFP 204 in FIG. 2 or IF FB BPF 301 in FIG. 3.

Table 1 is a table showing Adjacent Channel Leakage Power Ratio (ACLR) performance for embodiments of the present invention, whose values are taken from results of FIG. 6 and FIGS. 7A-7C. Table 1 is a table that shows in various rows the ACLR performance of: PA system without DPD, PA with conventional DPD approach, PA with DPD with 25 MHz FB BPF according to the present invention, PA with DPD with 30 MHz FB BPF according to the present invention and PA with DPD with 40 MHz FB BPF according to the present invention. Based on the data shown in Table 1, systems utilizing a FB BPF with 30 MHz minimum bandwidth are able to achieve performance similar to the conventional PA with DPD. Therefore, some embodiments of the present invention utilize a 30 MHz feedback path bandwidth, meaning that a feedback ADC with a sampling rate of only 60 Msps can be employed. This contrasts with conventional DPD systems that require a feedback ADC with 200 Msps or greater sampling rate for similar performance.

In some embodiments, a 60 Msps feedback ADC is used for a 20 MHz instantaneous input signal bandwidth and a Duplexer is used with 25 MHz bandwidth. In some embodiments, a Duplexer is used that has a bandwidth slightly larger than the instantaneous or operational input signal bandwidth. In some embodiments, the value of feedback bandwidth is set at a value approximately 20% greater than the instantaneous or operational input signal bandwidth. In some embodiments, a system which supports a 60 MHz instantaneous or operational input signal bandwidth has its value of feedback bandwidth set to 72 MHz, such as would result from employing a feedback ADC with a 144 Msps sampling rate. Thus, embodiments of the present invention provide benefits (including reduced cost and complexity) not available using a conventional DPD system employing a feedback ADC with a 250 Msps sampling rate, which is a popular choice for many conventional DPD systems.

TABLE 1

| SYSTEM DESCRIPTON | ACLR (dBc) @ +5 MHz(+10 MHz) | ACLR (dBc) @ −5 MHz(−10 MHz) |
|---|---|---|
| PA without DPD | −37.1(−38.8) | −28.2(−30.37) |
| Conventional DPD/ System(25 MHz) | −51.64(−51.83)/−52.29(−53.21) | −50.38(−51.14)/−50.84(−52.57) |
| DPD(25 MHz)/System(25 MHz) | −47.89(−45.6)/−48.72(−47.2) | −46.8(−45.46)/−47.46(−47.01) |
| DPD(30 MHz)/System(25 MHz) | −50.85(−50.2)/−51.54(−51.75) | −50.0(−50.84)/−50.49(−52.23) |
| DPD(40 MHz)/System(25 MHz) | −51.35(−51.45)/−51.99(−52.88) | −50.33(−51.46)/−50.79(−52.85) |

As illustrated in Table 1, the power amplifier without DPD has an ACLR value of −37.1 dBc and −28.2 dBc at +5 MHZ and −5 MHz, respectively. Using a conventional system, values of −51.64 dBc, etc. and −50.38 dBc, etc. are achieved. Utilizing embodiments of the present invention, as shown on the last three lines, values of −47.89 dBc, −50.85 dBc, and −51.35 dBc, respectively, are achieved. Thus, although performance is slightly degraded for the 25 MHz system of the present invention, performance improves for the 30 MHz system and is substantially equivalent for the 40 MHz system. Thus, embodiments of the present invention can utilize systems operating over a much narrower bandwidth (i.e., 40 MHz) than conventional DPD systems (i.e., 100 MHZ).

Figure 1:
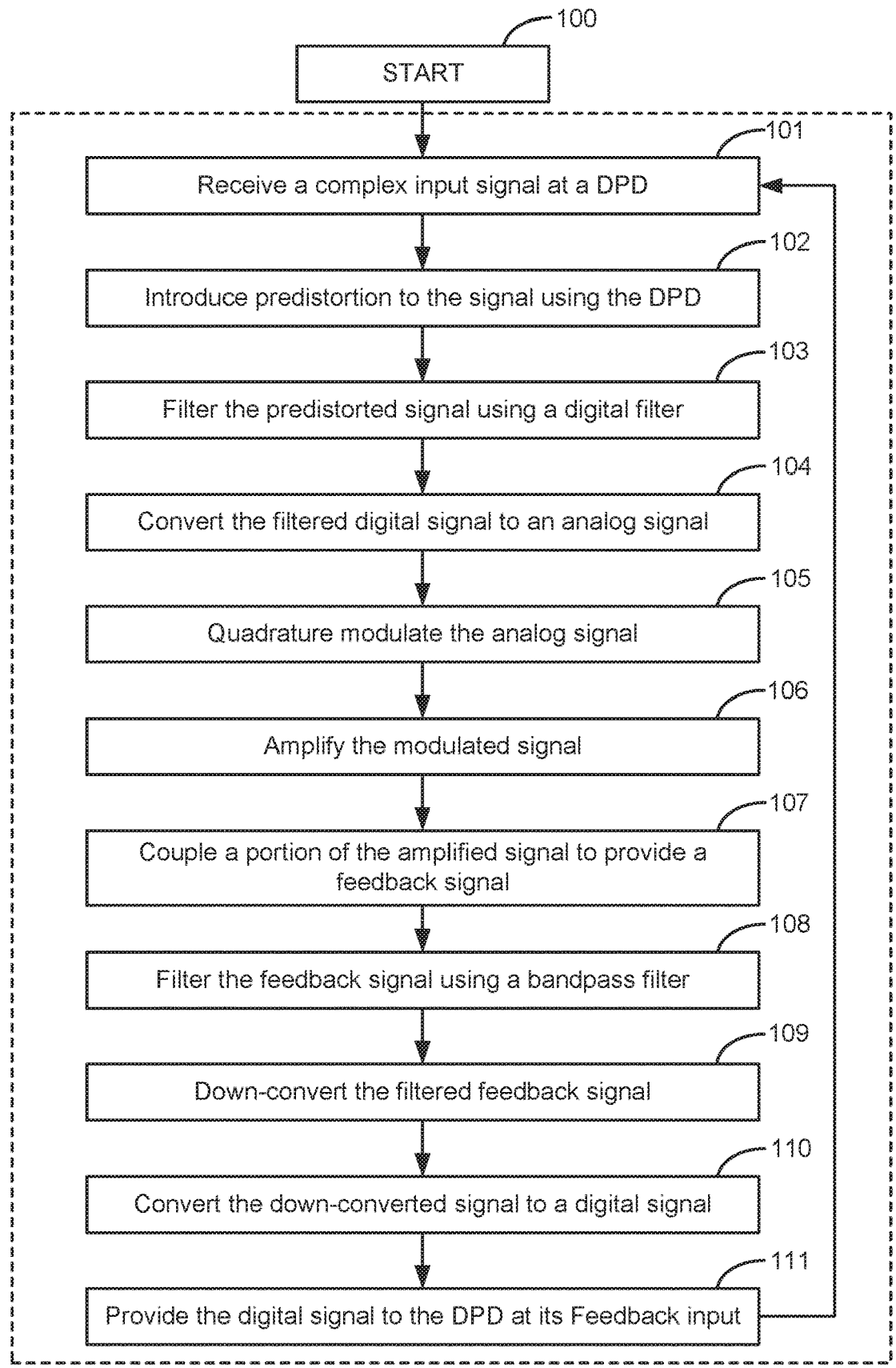
FIG. 1 is a simplified flowchart illustrating a method of increasing DPD linearization bandwidth according to an embodiment of the present invention.

FIG. 1 is a simplified flowchart illustrating a method of increasing DPD linearization bandwidth according to embodiments of the present invention. The method 100 includes receiving a complex input signal at a DPD (101) and introducing predistortion to the signal using the DPD (102). The method also includes filtering the predistorted signal using a digital filter (103) and converting the filtered signal to an analog signal (104). Filtering the predistorted signal can be performed over a filter bandwidth less than the bandwidth of the DPD, for example, over a filter bandwidth between 30 MHz and 50 MHz.

The method further includes quadrature modulating the analog signal (105), amplifying the modulated signal (106), coupling a portion of the amplified signal to provide a feedback signal (107), and filtering the feedback signal using a band-pass filter (108). Filtering the feedback signal using the band-pass filter can be performed over a band-pass bandwidth less than the bandwidth of the DPD, for example, the band-pass bandwidth can be between 30 MHz and 50 MHz.

Additionally, the method includes downconverting the filtered feedback signal (109), converting the downconverted signal to a digital signal (110), and providing the digital signal to the DPD at its feedback input (111). Converting the downconverted signal can be performed at a sampling rate less than twice the bandwidth of the DPD, for example, at a sampling rate is between 60 Msps and 100 Msps.

Figure 8:
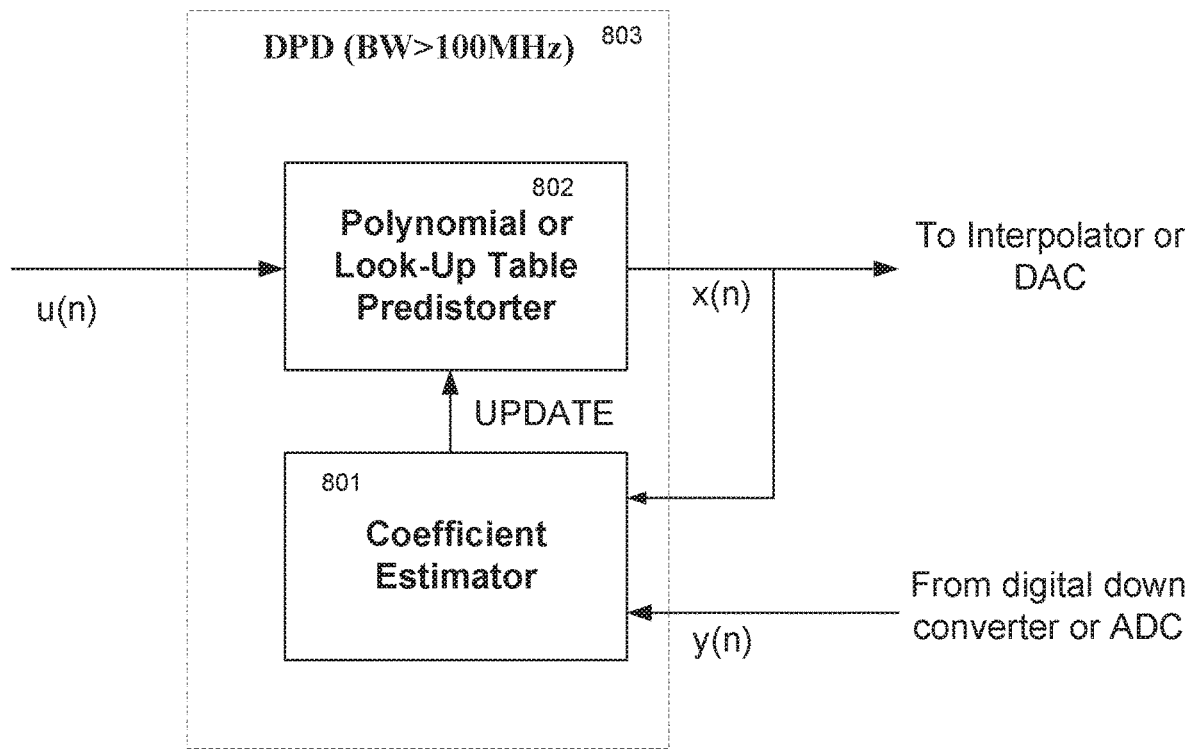
FIG. 8 shows a block diagram of the elements of a Digital Predistorter

FIG. 8 is a schematic diagram showing an embodiment of the Digital Predistorter system in accordance with the invention. The DPD 803 illustrated in FIG. 8 is analogous to DPD 202 in FIG. 2. As illustrated, u(n) is the input signal to the digital predistorter 803. The digital complex baseband input signal samples are multiplied by complex coefficients drawn from the LUT entries or from a polynomial.

$$x(n)=u(n) \cdot F_m(|u(n)|)$$

where $F_m(|u(n)|)$ is the complex coefficient corresponding to an input signal magnitude for compensating AM to AM and AM to PM distortions of the power amplifier. The memoryless LUT or polynomial coefficients can be estimated by the following equation, which is the least mean square (LMS) algorithm with indirect learning.

$$F_m(|u(n+1)|)=F_m(|u(n)|)+\mu \cdot u(n) \cdot e(n)$$

where n is the iteration number, $\mu$ is the stability factor and error $e(n)=x(n)-y(n) \cdot F_m(|x(n)|)$. The indirect learning algorithm is contained in the Coefficient Estimator block. This invention is also applicable to a memory based LUT or polynomial. In addition to the polynomial or LUT predistorter 802, the DPD 803 also includes a coefficient estimator 801. The output of the DPD is provided at x(n) to an interpolator or DAC, for example to FIR filter 203 and DAC 205 in FIG. 2. The feedback path provides feedback signal y(n), for example, received from ADC 210 in FIG. 2.

Figure 9:
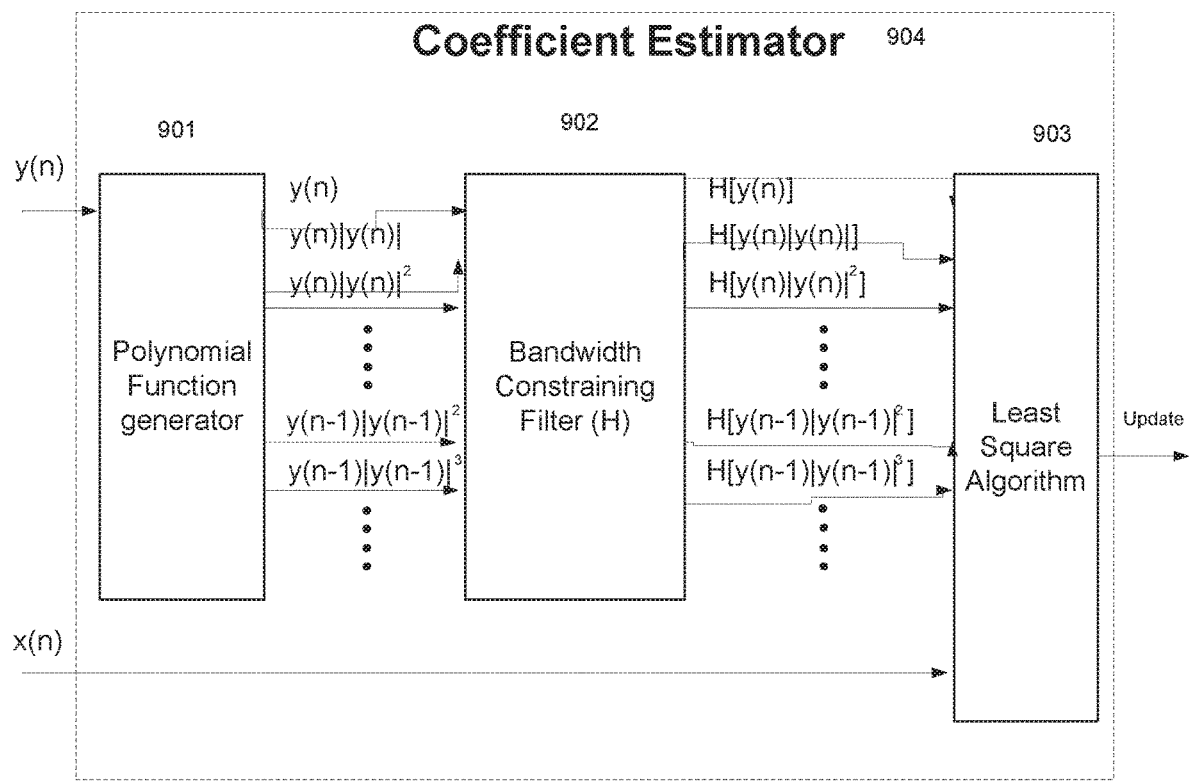
FIG. 9 shows a block diagram of Digital Predistortion Coefficient Estimator with a bandwidth-constrained filter

FIG. 9 shows a block diagram of the Coefficient Estimator 904 (illustrated by reference number 801 in FIG. 8). The Coefficient Estimator 904 includes a polynomial Function generator 901, a Bandwidth Constrained Filter 902, also referred to as a digital filter, and a Least Square Algorithm 903. The Function generator 901 creates all the nonlinear components used in the digital predistorter. The Bandwidth Constrained Filter (i.e., the digital filter) 902 restricts the bandwidth of the nonlinearities. In an embodiment, the bandwidth of the nonlinearities is restricted to ensure that they match those of the analog feedback filter in the system. The Least Square algorithm 903 optimizes the complex coefficients in order to reduce or minimize the error in the indirect learning algorithm.

Figure 10A:
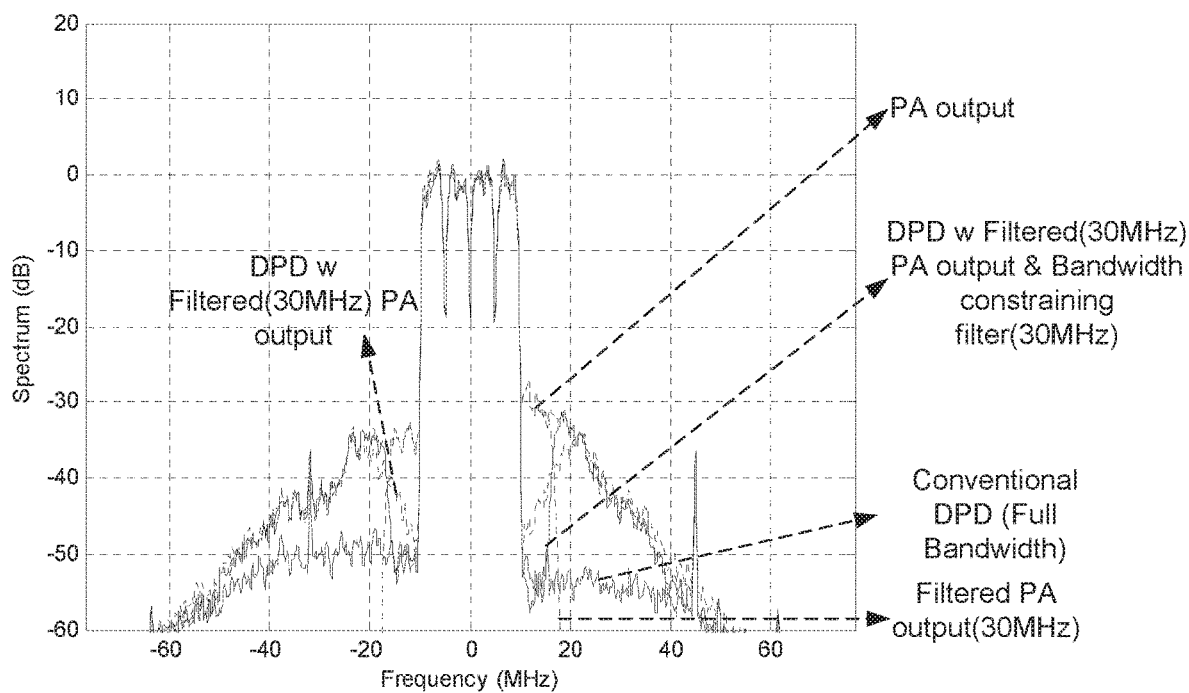
FIGS. 10A-10B are plots showing spectral output response for systems using a Digital Predistortion with a bandwidth-constrained filter in the coefficient estimator.
Figure 10B:
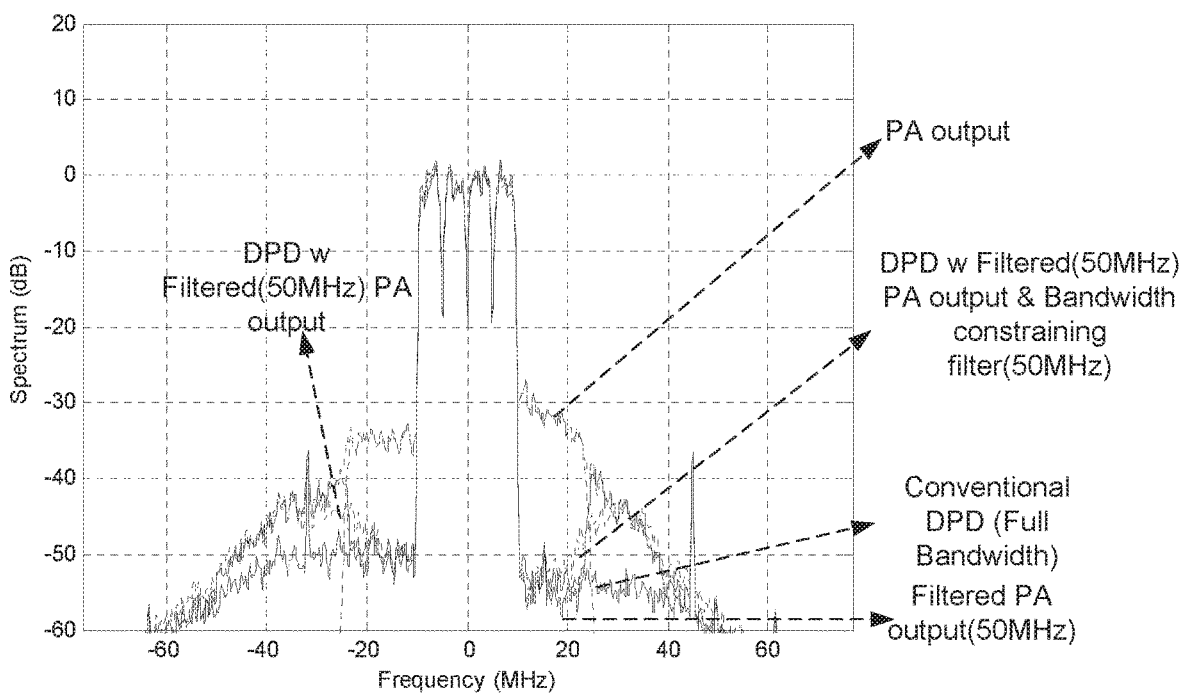

FIGS. 10A and 10B demonstrate the performance of the bandwidth constrained filter. FIG. 10A shows the performance when a 30 MHz bandwidth constrained filter is used. FIG. 10B shows the performance when a 50 MHz bandwidth constrained filter is used. The performance close to the carriers is comparable to the conventional full bandwidth DPD, however outside the constrained filter bandwidth the performance degrades to the PA output without DPD. The Duplexer that is used after the power amplifier will eliminate the nonlinearities that remain outside the bandwidth of the constrained filter.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method comprising:
   receiving an input signal at a digital predistorter (DPD);
   introducing predistortion to the input signal using the DPD to generate a predistorted input signal;
   filtering the predistorted input signal using a digital filter to generate a filtered input signal, wherein the predistorted input signal is filtered over a filter bandwidth less than a DPD bandwidth;
   amplifying the filtered input signal to generate an amplified signal; and
   filtering at least a portion of the amplified signal using a band-pass filter to generate a filtered feedback signal.

2. The method of claim 1, wherein introducing predistortion to the input signal using the DPD comprises applying an indirect learning algorithm.

3. The method of claim 2, wherein applying the indirect learning algorithm comprising using a coefficient estimator.

4. The method of claim 1, wherein introducing predistortion to the input signal using the DPD comprises applying a coefficient estimator.

5. The method of claim 1, wherein the input signal comprises digital complex input samples.

6. The method of claim 1, further comprising:
   converting the filtered input signal to an analog signal; and
   modulating the analog signal to generate a modulated signal.

7. The method of claim 6, wherein modulating the analog signal comprises using an analog quadrature modulator (AQM).

8. The method of claim 6, further comprising:
   downconverting the filtered feedback signal to generate a downconverted signal;
   converting the downconverted signal to a digital signal; and
   providing the digital signal to the DPD.

9. The method of claim 8, wherein downconverting the filtered feedback signal includes mixing the filtered feedback signal with a local oscillator signal.

10. The method of claim 8, further comprising:
    filtering a second portion of the amplified signal with a duplexer to generate an output signal; and
    transmitting the output signal.

11. The method of claim 8, wherein the band-pass filter comprises a radio frequency (RF) band-pass filter.

12. The method of claim 1, wherein the band-pass filter comprises an intermediate frequency (IF) band-pass filter.

13. A system comprising:
    a digital predistorter (DPD) configured to receive an input signal and to introduce predistortion to the input signal to generate a predistorted input signal;
    a digital filter configured to filter the predistorted input signal to generate a filtered input signal, wherein the predistorted input signal is filtered over a filter bandwidth less than a DPD bandwidth;
    an amplifier configured to amplify the filtered input signal to generate an amplified signal, and
    a band-pass filter configured to filter at least a portion of the amplified signal to generate a filtered feedback signal.

14. The system of claim 13, wherein the DPD is further configured to apply an indirect learning algorithm.

15. The system of claim 14, wherein the indirect learning algorithm comprising includes a coefficient estimator.

16. The system of claim 13, wherein the DPD is further configured to apply a coefficient estimator.

17. The system of claim 13, wherein the input signal comprises digital complex input samples.

18. The system of claim 13, further comprising:
    a digital to analog converter configured to convert the filtered input signal to an analog signal, and
    a modulator configured to modulate the analog signal to generate a modulated signal.

19. The system of claim 18, wherein the modulator is configured to use an analog quadrature modulator (AQM).

20. The system of claim 18, further comprising:
    a downconverter configured to downconvert the filtered feedback signal to generate a downconverted signal;
    an analog to digital converter configured to convert the downconverted signal to a digital signal; and
    an input at the DPD that receives the digital signal.

21. The system of claim 20, wherein the downconverter is further configured to mix the filtered feedback signal with a local oscillator signal.

22. The system of claim 20, further comprising:
    a duplexer configured to filter a second portion of the amplified signal to generate an output signal; and
    an antenna configured to transmit the output signal.

23. The system of claim 13, wherein the band-pass filter comprises a radio frequency (RF) band-pass filter.

24. The system of claim 13, wherein the band-pass filter comprises an intermediate frequency (IF) band-pass filter.

* * * * *